United States Patent
Liu et al.

(10) Patent No.: US 11,145,725 B2
(45) Date of Patent: Oct. 12, 2021

(54) HETEROJUNCTION BIPOLAR TRANSISTOR

(71) Applicant: GLOBALFOUNDRIES U.S. INC., Santa Clara, CA (US)

(72) Inventors: Qizhi Liu, Lexington, MA (US); Vibhor Jain, Williston, VT (US); Judson R. Holt, Ballston Lake, NY (US); Herbert Ho, New Windsor, NY (US); Claude Ortolland, Garrison, NY (US); John J. Pekarik, Underhill, VT (US)

(73) Assignee: GLOBALFOUNDRIES U.S. INC., Santa Clara, CA (US)

(*) Notice: Subject to any disclaimer, the term of this patent is extended or adjusted under 35 U.S.C. 154(b) by 0 days.

(21) Appl. No.: 16/823,005

(22) Filed: Mar. 18, 2020

(65) Prior Publication Data

US 2021/0091189 A1    Mar. 25, 2021

Related U.S. Application Data

(60) Provisional application No. 62/904,409, filed on Sep. 23, 2019.

(51) Int. Cl.
| | |
|---|---|
| *H01L 29/417* | (2006.01) |
| *H01L 29/66* | (2006.01) |
| *H01L 29/737* | (2006.01) |
| *H01L 29/08* | (2006.01) |

(52) U.S. Cl.
CPC .... *H01L 29/41708* (2013.01); *H01L 29/0804* (2013.01); *H01L 29/66242* (2013.01); *H01L 29/737* (2013.01)

(58) Field of Classification Search
CPC ............ H01L 29/41708; H01L 29/737; H01L 29/0804; H01L 29/66242
See application file for complete search history.

(56) References Cited

U.S. PATENT DOCUMENTS

| | | | |
|---|---|---|---|
| 2005/0184359 A1* | 8/2005 | Akatsu | H01L 29/0821 257/565 |
| 2006/0043529 A1* | 3/2006 | Chidambarrao | H01L 29/7378 257/565 |
| 2020/0066885 A1* | 2/2020 | Jain | H01L 29/0817 |

* cited by examiner

*Primary Examiner* — Syed I Gheyas
(74) *Attorney, Agent, or Firm* — Anthony Canale; Andrew M. Calderon; Roberts Calderon Safran & Cole, PC.

(57) ABSTRACT

The present disclosure relates to semiconductor structures and, more particularly, to a heterojunction bipolar transistor and methods of manufacture. The structure includes: a sub-collector region; a collector region in electrical connection to the sub-collector region; an emitter located adjacent to the collector region and comprising emitter material, recessed sidewalls on the emitter material and an extension region extending at an upper portion of the emitter material above the recessed sidewalls; and an extrinsic base separated from the emitter by the recessed sidewalls.

20 Claims, 5 Drawing Sheets

HETEROJUNCTION BIPOLAR TRANSISTOR

FIELD OF THE INVENTION

The present disclosure relates to semiconductor structures and, more particularly, to a heterojunction bipolar transistor and methods of manufacture.

BACKGROUND

A heterojunction bipolar transistor (HBT) is a type of bipolar junction transistor (BJT) which uses differing semiconductor materials for the emitter and base regions or collector and base regions, creating a heterojunction. Si/SiGe HBTs are used in power amplifier applications and require low collector-base capacitance (Ccb), low base resistance (Rb), high cut-off frequencies fT/fMAX and high breakdown voltage (BVceo).

SUMMARY

In an aspect of the disclosure, a structure comprises: a sub-collector region; a collector region in electrical connection to the sub-collector region; an intrinsic base; an emitter located adjacent to the collector region and above the intrinsic base, the emitter comprising emitter material, recessed sidewalls on the emitter material and an extension region extending at an upper portion of the emitter material above the recessed sidewalls; and an extrinsic base separated from the emitter by the recessed sidewalls.

In an aspect of the disclosure, a structure comprises: a sub-collector region; a collector region above the sub-collector region; a T-shaped emitter above the intrinsic base with a contact landing area on a top horizontal surface of the T-shaped emitter; and an extrinsic base self-aligned to the T-shaped emitter and contacting the intrinsic base.

In an aspect of the disclosure, a method comprises: forming a collector region; forming an emitter above the collector region; forming recessed sidewall structures on sidewalls of the emitter such that an upper portion of the sidewalls of the emitter are exposed; and growing semiconductor material adjacent to the emitter and on the exposed sidewall of the emitter above the recessed sidewall structures to form an extrinsic base and extensions to the emitter resulting in a T-shaped emitter.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a heterojunction bipolar transistor and methods of manufacture. More specifically, the present disclosure describes a heterojunction bipolar transistor with a T-shaped emitter. Advantageously, the T-shaped emitter provides a landing area for contact connection to the emitter.

In embodiments, the heterojunction bipolar transistor has a self-aligned emitter-base with a T-shape emitter. The opening of the emitter pedestal at its upper part will serve as the seed for lateral growth during the raised-extrinsic base growth process, forming the T-shape of the emitter. In embodiments, the "T" extensions can have a different material composition compared to the emitter material and a same material composition as the extrinsic base. Moreover, the heterojunction bipolar transistor includes a self-aligned emitter-extrinsic base junction with the extrinsic base formed below the emitter extensions, e.g., T shape of the emitter. Also, in embodiments, the extrinsic base extensions are provided on the side of emitter to allow for a wider contact formation region for a laterally scaled heterojunction bipolar transistor.

The heterojunction bipolar transistor can be manufactured in a number of ways using a number of different tools. In general, though, the methodologies and tools are used to form structures with dimensions in the micrometer and nanometer scale. The methodologies, i.e., technologies, employed to manufacture the heterojunction bipolar transistor of the present disclosure have been adopted from integrated circuit (IC) technology. For example, the structures are built on wafers and are realized in films of material patterned by photolithographic processes on the top of a wafer. In particular, the fabrication of the heterojunction bipolar transistor uses three basic building blocks: (i) deposition of thin films of material on a substrate, (ii) applying a patterned mask on top of the films by photolithographic imaging, and (iii) etching the films selectively to the mask.

Figure 1:
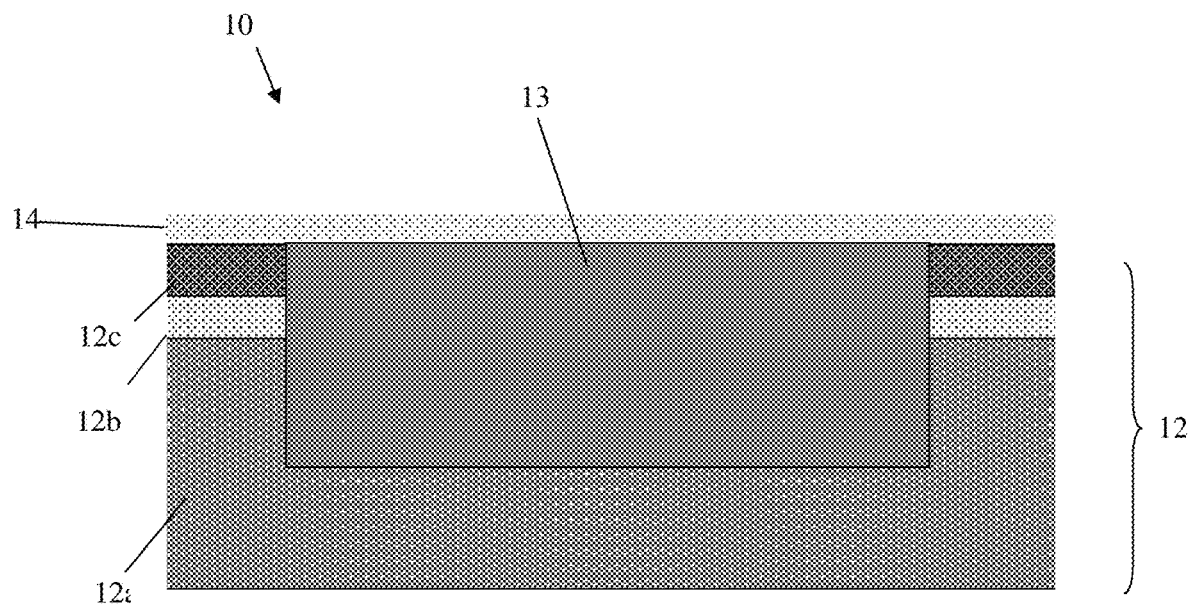
FIG. 1 shows a starting structure in accordance with aspects of the present disclosure.

FIG. 1 shows a starting substrate in accordance with aspects of the present disclosure. More specifically, in embodiments, the structure 10 includes a substrate 12 based on semiconductor on insulator technologies. For example, the substrate 12 can include a semiconductor wafer 12a composed of any suitable material including, but not limited to, Si, SiGe, SiGeC, SiC, GaAs, InAs, InP, and other III/V or II/VI compound semiconductors. An insulator material 12b is located on the semiconductor wafer 12a. The insulator material 12b comprises any suitable material including silicon oxide, sapphire, other suitable insulating materials, and/or combinations thereof. An exemplary insulator layer may be a buried oxide layer (BOX) formed by any suitable process such as separation by implantation of oxygen (SI- MOX), oxidation, deposition, and/or other suitable process. A semiconductor material 12c is formed on the insulator material 12b. In embodiments, the semiconductor material 12c can be composed of any suitable material including, but not limited to, Si, SiGe, SiGeC, SiC, GaAs, InAs, InP, and other III/V or II/VI compound semiconductors. The semiconductor material 12c can be fabricated using wafer bonding, and/or other suitable methods.

Still referring to FIG. 1, the substrate 12 is subjected to lithography and etching processes to form a trench extending into the semiconductor wafer 12a. More specifically, a resist formed over the semiconductor material 12c is exposed to energy (light) to form a pattern (opening). An etching process with a selective chemistry, e.g., reactive ion etching (RIE), will be used to form one or more trenches extending into the semiconductor material 12a through the openings of the resist. Following the resist removal by a conventional oxygen ashing process or other known stripants, a bulk semiconductor material 13 is deposited in the trench by any conventional deposition processes, e.g., epitaxial growth process. In embodiments, the semiconductor material 13 is Si material, although other materials are also contemplated.

The semiconductor material 13 can be subjected to a doping process to form a sub-collector region of the heterojunction bipolar transistor. The sub-collector region can be a highly doped n-type region, i.e., phosphorus or arsenic, formed by ion implantation processes or other known diffusion processes as described herein. In embodiments, the sub-collector region can also be formed from a heavily doped epitaxy layer of material grown on the semiconductor material 13.

More specifically, the well implants, e.g., sub-collector region of the semiconductor material 13 and other doped features, can be formed by introducing a dopant by, for example, ion implantation that introduces a concentration of dopant in the substrate. For any implantation processes described herein, respective patterned implantation masks may be used to define selected areas exposed for the implantations. The implantation mask used to select the exposed area for forming well is stripped after implantation, and before the implantation mask used to form well. Similarly, the implantation mask used to select the exposed area for forming the sub-collector region is stripped after the implantation is performed. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions. Different dopant types are contemplated herein including P-type dopants, e.g., Boron (B), and n-type dopants, e.g., Arsenic (As), Phosphorus (P) and Sb, among other suitable examples.

FIG. 1 further shows an insulator material 14 deposited over the semiconductor material 13 and remaining portions of the substrate 12. In embodiments, the insulator material 14 can be an oxide material deposited by a conventional deposition process, e.g., chemical vapor deposition (CVD), deposited during formation of CMOS devices on the substrate 12. For example, after the formation of transistors or other CMOS devices on the substrate 12, the insulator material 14 will be deposited to form an interlevel dielectric layer. It should be understood by those of ordinary skill in the art, though, that the use of the substrate 12 as a beginning structure is one non-limiting illustrative example, and that the structures described, e.g., heterojunction bipolar transistor can simply be fabricated on the bulk semiconductor.

Figure 2:
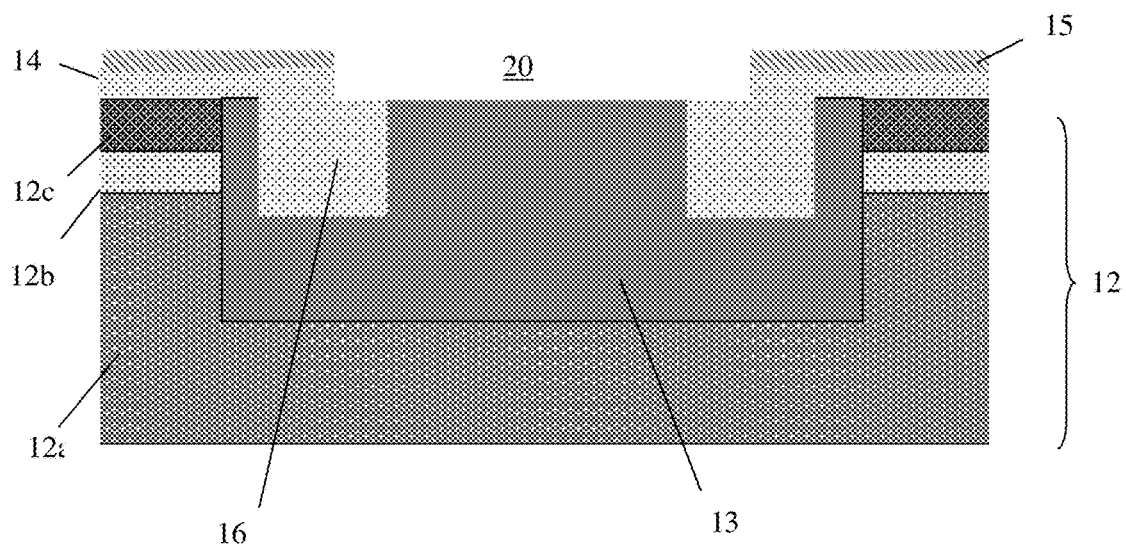
In FIG. 2 shows shallow trench isolation structures in a substrate, amongst other features, and respective fabrication processes in accordance with aspects of the present disclosure.

In FIG. 2, shallow trench isolation structures 16 are formed in the semiconductor material 13. In embodiments, the shallow trench isolation structures 16 can be formed by conventional lithography, etching and deposition methods known to those of skill in the art. For example, a resist formed over the insulator material 14 is exposed to energy (light) to form a pattern (opening). An etching process with a selective chemistry, e.g., reactive ion etching (RIE), will be used to form one or more trenches in the semiconductor material 13 through the openings of the resist. Following the resist removal with conventional oxygen ashing process or other known stripants, insulator material, e.g., oxide material, can be deposited by any conventional deposition processes, e.g., chemical vapor deposition (CVD) processes. Any residual material on the surface of the insulator material 14 can be removed by conventional chemical mechanical polishing (CMP) processes.

Thereafter, an optional poly material 15 can be deposited over the insulator material 14, again used in the formation of CMOS devices. The optional poly material 15 can be deposited over the insulator material 14, by any conventional deposition process. An opening 20 is formed through the optional poly material 15 and the insulator material 14 using conventional lithography and etching processes. The opening 20 will expose the underlying semiconductor material 13.

Figure 3:
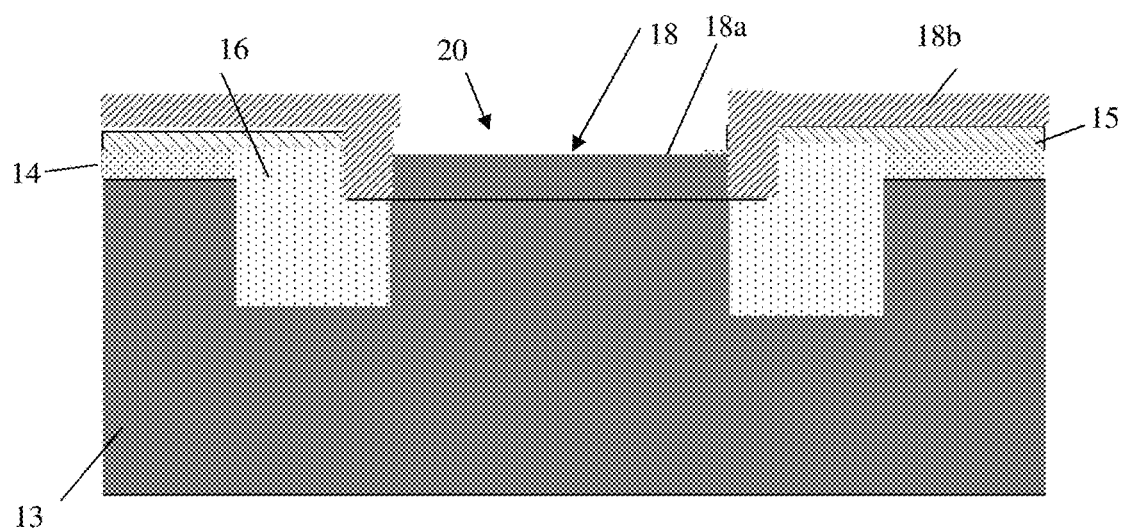
FIG. 3 shows a collector region formed over the substrate between the shallow trench isolation structures, amongst other features, and respective fabrication processes in accordance with aspects of the present disclosure.

FIG. 3 further shows a collector region 18 formed over the semiconductor material 13 between the shallow trench isolation structures 16. It should be noted that the formation of the collector region 18 can occur prior to or after the formation of the shallow trench isolation structures 16, depending on the desired process scheme. In any scenario, the collector region 18 is formed of semiconductor material, e.g., undoped Si material 18a. To form the collector region 18, an epitaxial film of semiconductor material 18a is selective grown within the opening 20. The epitaxial film of semiconductor material 18a will form as a single crystalline semiconductor material within the opening 20 (which is formed in direct contact with the underlying semiconductor material 13); whereas, polysilicon material 18b will form over the oxide regions of the structure, e.g., on the shallow trench isolation structures 16 and the insulator material 14 (or optional poly material 15). The collector region 18 will be in electrical contact with the sub-collector region of the semiconductor material 13.

Figure 4:
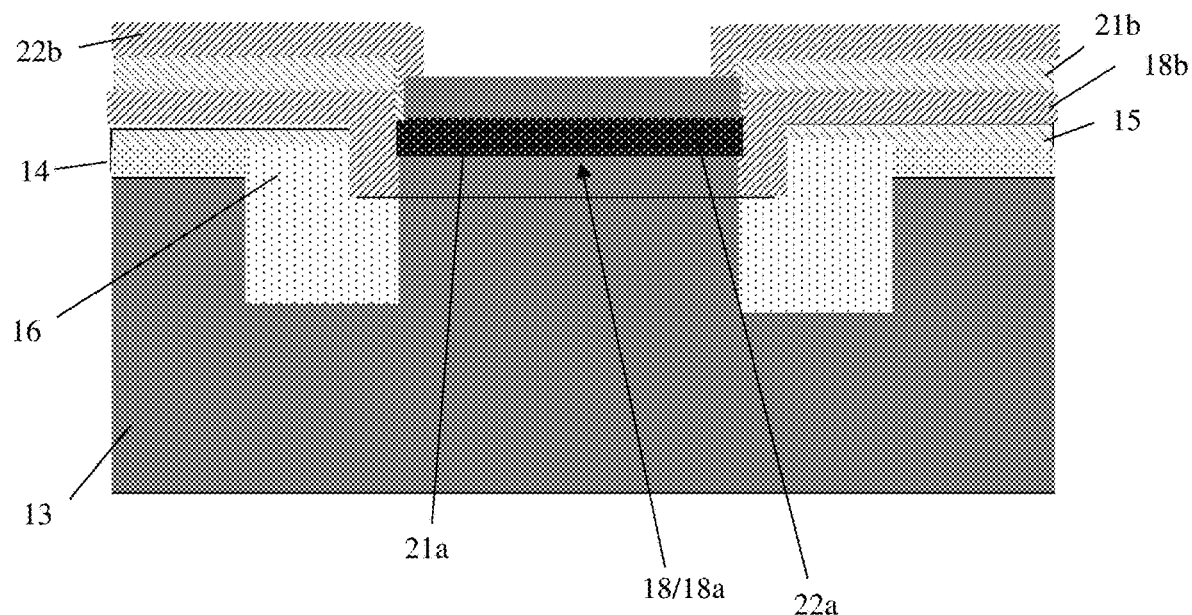
FIG. 4 shows an epitaxial semiconductor material on the collector region, amongst other features, and respective fabrication processes in accordance with aspects of the present disclosure.

In FIG. 4, a doped epitaxial semiconductor material is formed on the single crystalline semiconductor material 18a and the polysilicon material 18b. More specifically, the epitaxial material can be a SiGe material grown over both the single crystalline semiconductor material 18a and the polysilicon material 18b, resulting in single crystalline SiGe material 21a (over the single crystalline semiconductor material 18a) and polysilicon SiGe material 21b (over the polysilicon material 18b). Also, in an example, the epitaxial semiconductor material can be in situ p-doped using, e.g., boron. As should be understood by those of ordinary skill in the art, the epitaxial semiconductor material will define the intrinsic base of the heterojunction bipolar transistor. The epitaxial semiconductor material can also provide a defined end point for subsequent patterning processes.

Still referring to FIG. 4, an undoped semiconductor material is formed on the epitaxial semiconductor material 21a, 21b. In embodiments, the undoped semiconductor material is Si material; although other semiconductor materials are also contemplated herein. The undoped semiconductor material is epitaxially grown over the material 21a, 21b, resulting in a single crystalline epitaxial material 22a on the single crystalline SiGe base material 21a and polysilicon material 22b on the polysilicon SiGe base material (e.g., over the shallow trench isolation structures and related poly field).

Figure 5:
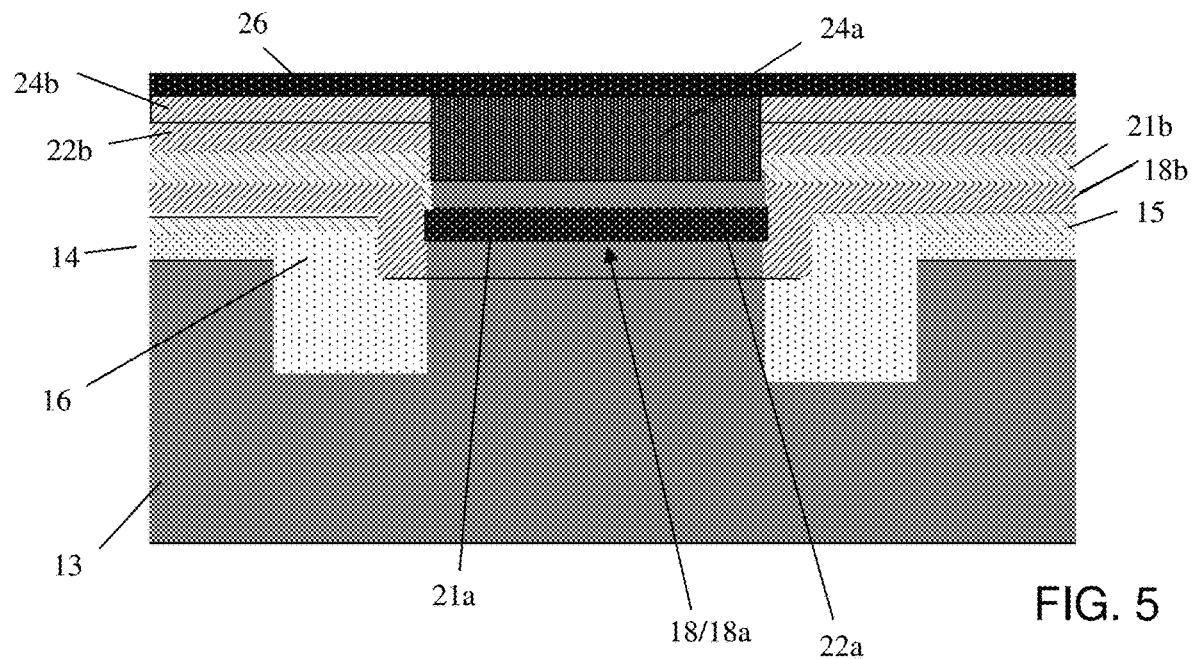
FIG. 5 shows a semiconductor emitter material, amongst other features, and respective fabrication processes in accordance with aspects of the present disclosure.

FIG. 5 shows a semiconductor emitter material, amongst other features, and respective fabrication processes. In embodiments, the semiconductor emitter material is an epitaxially grown semiconductor material on the single crystalline epitaxial material 22a and polysilicon material 22b, resulting in a single crystalline epitaxial material 24a and polysilicon material 24b, respectively. The single crystalline epitaxial material 24a will form the emitter of the heterojunction bipolar transistor. In embodiments, the semiconductor emitter material is N+ doped Si material; although other semiconductor materials are also contemplated herein. By way of example, the semiconductor emitter material can be in-situ doped with arsenic or other N+ dopant during the growth process. A hardmask material 26 is deposited on the single crystalline epitaxial material 24a and polysilicon material 24b using conventional deposition methods, e.g., CVD. The hardmask material 26 can be a nitride material, for example.

Figure 6:
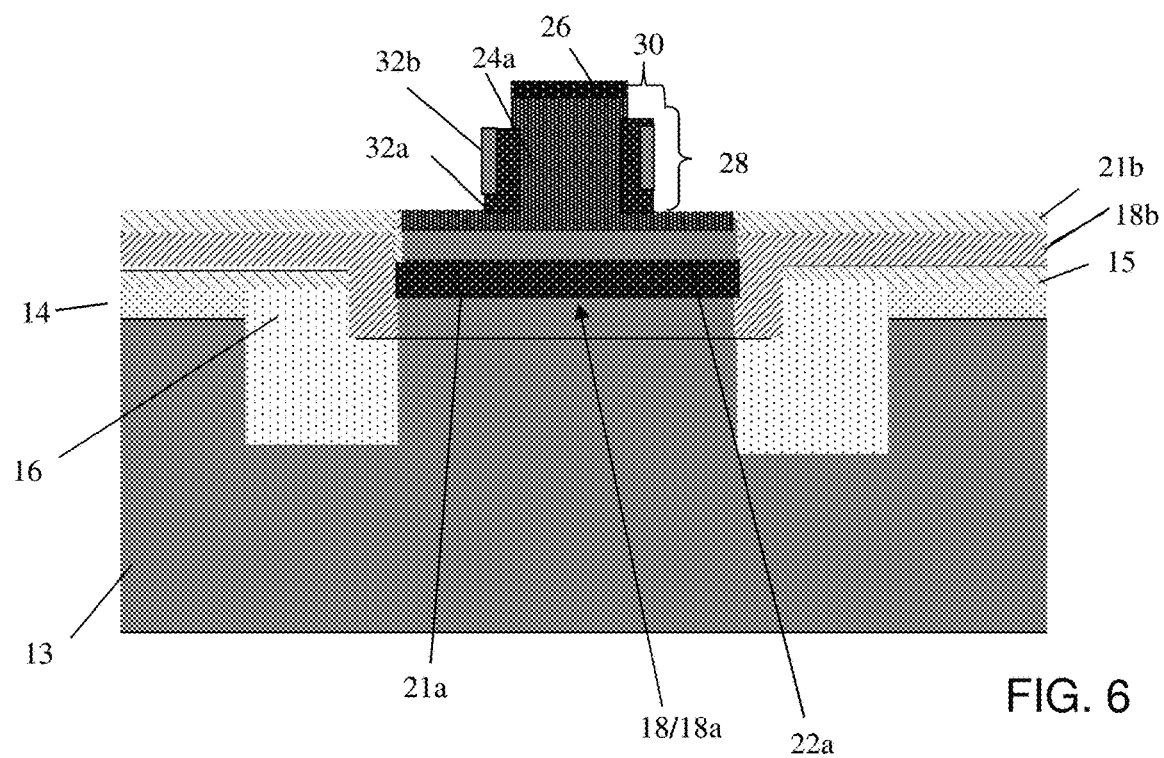
FIG. 6 shows the emitter with sidewalls, amongst other features, and respective fabrication processes in accordance with aspects of the present disclosure.

FIG. 6 shows an emitter 28 with sidewalls 30, amongst other features, and respective fabrication processes. In embodiments, the emitter 28 is patterned by conventional etching processes, leaving behind the single crystalline epitaxial material 24a and the hardmask material 26. It should be understood that the etching process will stop at the defined end point of the polysilicon SiGe material 21b. For example, as should be understood by those of skill in the art, the polysilicon SiGe material 21b will provide an endpoint signal indicating that the etch process should stop. In further embodiments, a slight over-etch can be provided to remove unwanted polysilicon SiGe material 21b.

Still referring to FIG. 6, sidewalls 30 are formed on (e.g., around) vertical sides of the emitter 28. In this process, an oxide material 32a is blanket deposited on the emitter 28 and directly over the polysilicon SiGe material 21b. A nitride material 32b is then blanket deposited on the oxide material 32a. An anisotropic etching process is used to remove the nitride material 32b on the horizontal surfaces of the structure, followed by an anisotropic etching process to remove the oxide material 32a on the horizontal surfaces of the structure. In embodiments, the thickness of nitride material 32b is such that the nitride portion of the sidewall will slightly recess during the etching process to expose an upper portion of the emitter 26, i.e., opening at the top side of the emitter pedestal. In this way, the oxide material 32a and the nitride material 32b, which form the sidewalls 30, will remain partially on the vertical surfaces (e.g., sidewalls) of the emitter 28, with an upper portion of the semiconductor material 24a being exposed. The patterning process, e.g., etching, can be achieved by hot phosphorous acid post nitride spacer formation.

Figure 7:
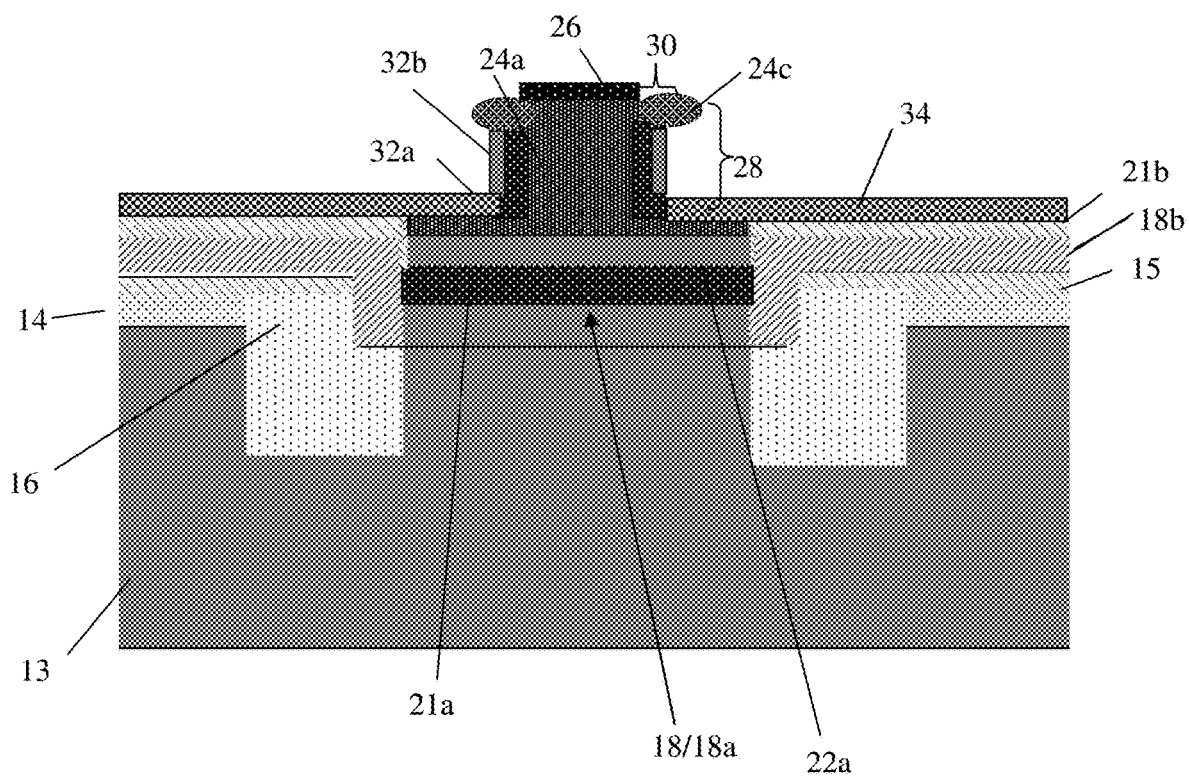
FIG. 7 shows emitter extensions and a raised extrinsic base, amongst other features, and respective fabrication processes in accordance with aspects of the present disclosure.

FIG. 7 shows emitter extensions 24b and a raised extrinsic base 34, fabricated using respective fabrication processes. Prior to the formation of the emitter extensions 24c and raised extrinsic base 34, an oxide etch can be performed to clean any surfaces of excess oxide, such as, e.g., SiCoNi or chemical oxide removal (COR). In embodiments, the raised extrinsic base 34 is a P-doped semiconductor material that is grown on the single crystalline epitaxial material 24a and polysilicon SiGe material 21b by known epitaxial growth processes such that no further explanation is required herein for an understanding of the present disclosure. The raised extrinsic base 34 will be separated from the emitter 28 by the sidewalls 30, and will electrically and physically contact the intrinsic base.

During the growth process of the raised extrinsic base 34, the emitter extensions 24c will grow from the exposed portion of the emitter 28 (which acts as a seed layer), extending outwardly from the exposed portion of the single crystalline epitaxial material 24a above an upper surface of the recessed sidewalls 30. Moreover, due to epitaxial growth of the emitter extensions 24c, the emitter extensions 24c will be symmetric. In embodiments, the emitter extensions 24c and raised extrinsic base 34 can be Si or SiGe, as examples. And, as should be understood by those of ordinary skill in the art, the raised extrinsic base 34 will grow as a single crystalline semiconductor material over the single crystalline epitaxial material 24a and as polysilicon material over the poly material 18b. Also, part of the raised extrinsic base 34 (and collector region 18) will be vertically below the emitter extensions 24c.

Also, as shown in FIG. 7, the combination of the single crystalline epitaxial material 24a and the emitter extensions 24c will form a "T" shaped emitter 28; albeit with two different materials (Si and SiGe). The emitter extensions 24c will be N-doped semiconductor material due to dopant diffusion from the single crystalline epitaxial material 24a. In embodiments, the emitter extensions 24c provide for a larger process window for contact landings. Also, it is desirable to have a faceted growth of the raised extrinsic base 34, e.g., with a slope or angle other than 90 degrees.

Figure 8:
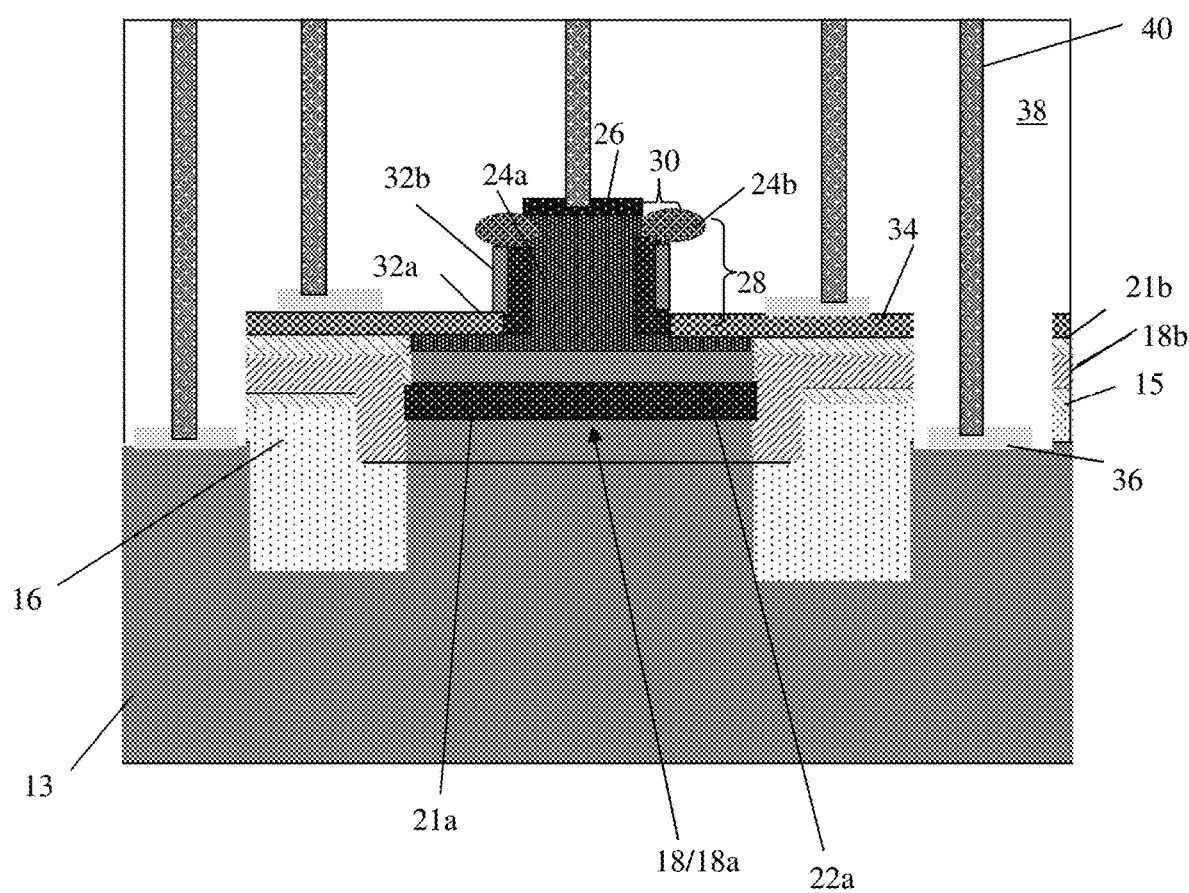
FIG. 8 shows contacts to the emitter, raised extrinsic base and sub-collector region, amongst other features, and respective fabrication processes in accordance with aspects of the present disclosure.

FIG. 8 shows contacts 40 to the emitter 28, raised extrinsic base 34 and sub-collector region 13, amongst other features, and respective fabrication processes in accordance with aspects of the present disclosure. Prior to contact formation, the portions of the raised extrinsic base 34 and poly materials 18b, 21b, 22b, 24b are removed to expose the sub-collector region 13. The raised extrinsic base 34 and poly materials 18b, 21b, 22b, 24b can be removed by conventional selective etching processes known to those of skill in the art.

Silicide contacts 36 are formed in contact with the emitter 28, extrinsic base 34 and sub-collector region 13. As should be understood by those of skill in the art, the silicide process begins with deposition of a thin transition metal layer, e.g., nickel, cobalt or titanium, over fully formed and patterned semiconductor materials. After deposition of the material, the structure is heated allowing the transition metal to react with exposed silicon (or other semiconductor material as described herein) forming a low-resistance transition metal silicide contacts 36. Following the reaction, any remaining transition metal is removed by chemical etching, leaving silicide contacts.

A dielectric material 38 is deposited over the structure, followed by lithography, etching and deposition processes (e.g., metallization process). For example, the dielectric material 36 is deposited by a CVD process, followed by the lithography and etching (e.g., RIE) processes to form trenches within the dielectric material 38. A metal material, e.g., aluminum or tungsten, is deposited within the trenches to form the contacts 40, e.g., collector contact, emitter region contact and extrinsic base contact. Any residual metal material can be removed from the surface of the dielectric material 38 by a conventional chemical mechanical planarization process.

The heterojunction bipolar transistor can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    a sub-collector region;
    a collector region in electrical connection to the sub-collector region;
    an intrinsic base;
    an emitter located adjacent to the collector region and above the intrinsic base, the emitter comprising emitter material, recessed sidewalls on the emitter material and an extension region extending at an upper portion of the emitter material above the recessed sidewalls; and
    an extrinsic base separated from the emitter by the recessed sidewalls.

2. The structure of claim 1, wherein the emitter is T-shaped.

3. The structure of claim 1, wherein the extrinsic base is a same semiconductor material as the extension region of the emitter.

4. The structure of claim 3, wherein the extrinsic base has a dopant profile different from a dopant profile of the extension region.

5. The structure of claim 4, wherein the extrinsic base is P-doped and the extension region is N-doped.

6. The structure of claim 3, wherein the extrinsic base and the extension region of the emitter are epitaxially grown semiconductor material.

7. The structure of claim 6, wherein the extrinsic base is a raised extrinsic base on a side of the emitter.

8. The structure of claim 3, wherein part of extrinsic base and collector region will be vertically below the extension region of the emitter.

9. The structure of claim 3, wherein the extrinsic base is faceted with a slope or angle other than 90 degrees.

10. The structure of claim 3, wherein semiconductor material of the collector region, sub-collector region and the emitter is single crystalline material.

11. The structure of claim 3, wherein the extension region of the emitter is symmetrical and extends outwardly above a top surface of the recessed sidewalls.

12. A structure comprising:
    a sub-collector region;
    a collector region above the sub-collector region;
    a T-shaped emitter above the intrinsic base with a contact landing area on a top horizontal surface of the T-shaped emitter, wherein the T-shaped emitter comprises two different materials; and
    an extrinsic base under and adjacent to the T-shaped emitter and contacting the intrinsic base.

13. The structure of claim 12, wherein the extrinsic base is a raised extrinsic base.

14. The structure of claim 13, wherein the raised extrinsic base comprises a same epitaxial semiconductor material as horizontal leg portions of the T-shaped emitter.

15. The structure of claim 14, wherein the extrinsic base has a dopant different profile from a dopant profile the T-shaped emitter.

16. The structure of claim 15, wherein the extrinsic base is P doped and the T-shaped emitter is N doped.

17. The structure of claim 14, further comprising contacts connecting directly to the contact landing area of the T-shaped emitter which is between the horizontal leg portions.

18. The structure of claim 14, wherein part of the extrinsic base is vertically below the T-shaped emitter.

19. The structure of claim 12, wherein horizontal extending portions of the T-shaped emitter comprises a first material and a vertical portion of the T-shaped emitter comprises a second material.

20. A method, comprising
    forming a collector region;
    forming an emitter above the collector region;
    forming recessed sidewall structures on sidewalls of the emitter such that an upper portion of the sidewalls of the emitter are exposed; and
    growing semiconductor material adjacent to the emitter and on the exposed sidewall of the emitter above the recessed sidewall structures to form an extrinsic base and extensions to the emitter resulting in a T-shaped emitter.

* * * * *